United States Patent [19]

Kalthoff et al.

[11] Patent Number: 5,103,230

[45] Date of Patent: Apr. 7, 1992

[54] PRECISION DIGITIZED CURRENT INTEGRATION AND MEASUREMENT CIRCUIT

[75] Inventors: Timothy V. Kalthoff; Rodney T. Burt, both of Tucson, Ariz.

[73] Assignee: Burr-Brown Corporation, Tucson, Ariz.

[21] Appl. No.: 679,556

[22] Filed: Apr. 2, 1991

[51] Int. Cl.⁵ .............................................. H03M 1/50
[52] U.S. Cl. .................................... 341/166; 341/163; 341/152
[58] Field of Search ............... 341/128, 129, 143, 150, 341/152, 153, 155, 158, 161, 162, 163, 164, 165, 166, 167, 168, 172

[56] References Cited

U.S. PATENT DOCUMENTS

| | | | |
|---|---|---|---|
| Re. 29,992 | 5/1979 | Wold | 341/118 |
| 2,692,975 | 10/1954 | Levy | 341/155 |
| 3,261,012 | 7/1966 | Bentley | 341/164 |
| 3,517,339 | 6/1970 | Hubbard et al. | 341/157 |
| 3,879,724 | 4/1975 | McDonald | 341/131 |
| 3,942,173 | 3/1976 | Wold | 341/118 |
| 4,293,848 | 10/1981 | Cheng et al. | 341/136 |
| 4,361,831 | 11/1982 | Grutzediek et al. | 341/131 |
| 4,553,128 | 11/1985 | Pilost | 341/161 |
| 4,593,270 | 6/1986 | White | 341/163 |
| 4,602,243 | 7/1986 | Von Bargen et al. | 341/123 |
| 4,672,361 | 6/1987 | Kokubo et al. | 341/141 |
| 4,764,753 | 8/1988 | Yukawa | 341/166 |
| 4,768,019 | 8/1988 | Linder | 341/166 |
| 4,792,787 | 12/1988 | Speiser et al. | 341/156 |
| 4,851,838 | 7/1989 | Shier | 341/121 |
| 4,940,982 | 7/1990 | Gulczynski | 341/169 |
| 4,945,359 | 7/1990 | Yamakido | 341/143 |
| 4,947,169 | 8/1990 | Smith et al. | 341/121 |

FOREIGN PATENT DOCUMENTS 3605701  4/1987  Fed. Rep. of Germany .

*Primary Examiner*—Howard L. Williams
*Attorney, Agent, or Firm*—Cahill, Sutton & Thomas

[57] ABSTRACT

A current-integrating analog-to-digital converter includes a comparator having a non-inverting input coupled to a ground voltage and an inverting input coupled to an input conductor carrying an analog input current. An integrating capacitor having one terminal coupled to the input conductor and another terminal coupled to an output of a digital-to-analog converter. A tracking circuit is coupled to an output of the comparator to apply digital signals to inputs of the digital-to-analog converter to maintain the inverting input close to a virtual ground voltage. A digital filter filters the digital signals to produce a digital output signal that precisely represents the input current. The tracking circuit includes a first integrator having an input coupled to the output of the comparator, a predictor circuit producing average step rate information in response to an output of the first integrator, and a second integrator producing the digital signals in response to the predictor means to produce accurate tracking. The integrating capacitor and digital-to-analog converter are included in a CDAC.

19 Claims, 2 Drawing Sheets

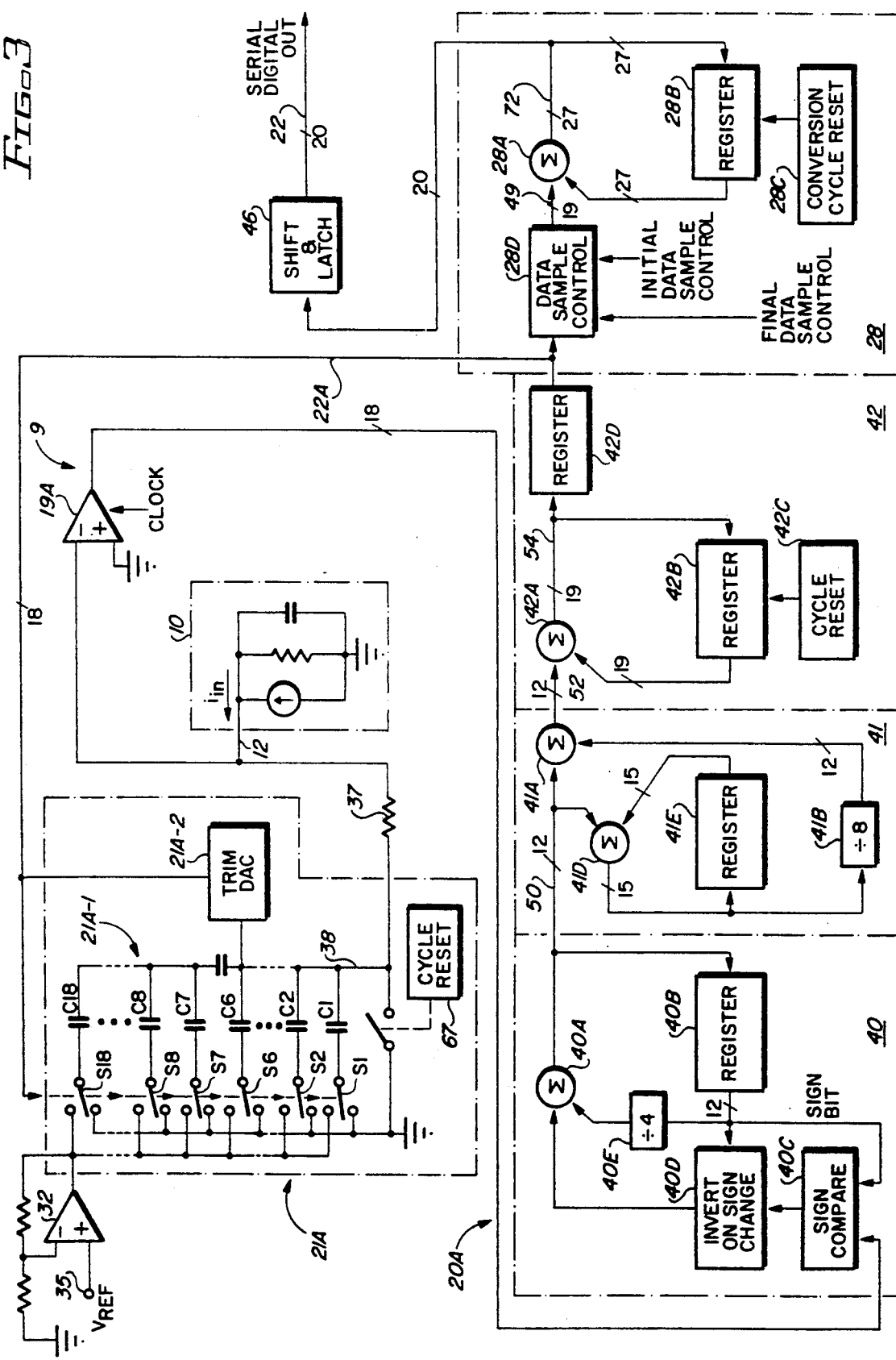

PRECISION DIGITIZED CURRENT INTEGRATION AND MEASUREMENT CIRCUIT

BACKGROUND OF THE INVENTION

The invention relates to a circuit and method in a data acquisition system for sensing minute currents (for example, currents produced by sensors) to produce very accurate digital output signals that precisely represent the currents. The invention relates more particularly to such a circuit which can be entirely integrated on a single chip, and reduces errors due to electrical system noise, input noise, amplifier offset voltages, and also reduces errors produced in an analog-to-digital converter.

Conventional techniques for integrating and digitizing minute currents (e.g. $10^{-12}$ amperes to 10 microamperes) usually include an operational amplifier and an integrating capacitor that operate to produce an output voltage which then is measured by an analog-to-digital converter. FIG. 1 shows such a system, in which a sensor 10 has the equivalent circuit shown. The purpose of the circuit of FIG. 1 is to provide a digital output signal on bus 22 that precisely represents the analog input signal $i_{in}$ produced by sensor 10. A conventional integrator 11 includes an operational amplifier 11A and an integrating capacitor 11B connected between the output of operational amplifier 11A and its inverting input. A reset switch 11C performs the function of resetting integrator 11 to a suitable reference voltage after each integration cycle has been completed to allow a new integration cycle to begin. Feedback causes operational amplifier 11A to change its output voltage as necessary to maintain the inverting input on conductor 12 at a virtual ground voltage. Consequently, an analog output voltage proportional to the sensor current $i_{in}$ is applied to the input of analog filter 13.

Analog filter 13 reduces high frequency noise at the output of operational amplifier 11A, and applies its output signal to the input of a programmable gain amplifier 14. The purpose of programmable gain amplifier 14, which must be an expensive, high accuracy, component, is to maximize use of the dynamic range of analog-to-digital converter 18. The output of programmable gain amplifier 14 is applied to the input of a sample and hold amplifier 16, which holds an amplified analog voltage on conductor 16A to accurately represent sensor input current $i_{in}$. Resetting of integrating capacitor 11B is synchronized with sampling of the output of programmable gain amplifier 14 by means of sample and hold amplifier 16.

Block 18 contains an analog-to-digital converter (ADC) that converts the voltage 16A to the desired digital output voltage 22. The voltage 16A is applied to the non-inverting input of comparator 19. ADC 18 includes a digital-to-analog converter (DAC) 21, the output of which is connected to the inverting input of comparator 19. Bus 22A is connected to the digital inputs of DAC 21. A logic circuit 20 performs the function of producing successive digital outputs representing the voltage 16A on bus 22A until the inverting input of comparator 19 is equal to the voltage on conductor 16A. Bus 22 provides the final digitized output of the data acquisition system.

Shortcomings of the prior art circuit of FIG. 1 include the fact that analog filter 13, programmable gain amplifier 14, and sample and hold circuit 16 all are expensive circuits. Furthermore, electronic noise of operational amplifier 11A and ADC 18 and offset errors of operational amplifier 11A and ADC 18 tend to reduce the accuracy of the digital output on bus 22.

Other shortcomings of the prior art circuit of FIG. 1 include reset kT/C errors and reset charge injection errors. Various errors associated with analog-to-digital converter 18 also significantly reduce the accuracy of the digital output on bus 22. Voltage coefficients associated with integrating capacitor 11B of the circuit of FIG. 1 produce nonlinearities that reduce the accuracy of the digital output.

It can be seen that there is an unmet need for a low cost circuit that rapidly and accurately digitizes minute analog input signals generated by various transducers.

SUMMARY OF THE INVENTION

Accordingly, it is an object of the invention to provide a circuit and method for precisely digitizing very low level analog input currents.

It is another object of the invention to provide an improved technique for precisely measuring and accurately digitizing minute currents produced by analog sensors.

It is another object of the invention to provide an inexpensive monolithic integrated circuit suitable for use as a data acquisition system to convert minute sensor signals into accurately digitized digital words.

It is another object of the invention to provide a circuit and method of the foregoing type which avoids inaccuracies due to effects of voltage coefficients associated with integrating capacitors.

Briefly described, and in accordance with one embodiment thereof, the invention provides a current-integrating analog-to-digital converter including a comparator having a non-inverting input coupled to receive a ground voltage and an inverting input coupled to an input conductor carrying an input current, an integrating capacitor having a first terminal coupled to the input conductor, a digital-to-analog converter having an output coupled to a second terminal of the integrating capacitor, and a tracking circuit coupled to an output of the comparator to produce digital signals applied to inputs of the digital-to-analog converter to maintain the inverting input close to a virtual ground voltage. A digital signal on the inputs of the digital-to-analog converter represents the integration of the input current when the inverting input is close to the virtual ground voltage. In the described embodiment, the digital signals are digitally filtered to produce a digital output signal that precisely represents the input current. A reset switch resets the integrating capacitor to a reference voltage at the beginning of each integration cycle. The tracking means includes a first integrator having an input coupled to the output of the comparator, a predictor circuit for producing average step rate information in response to an output of the first integrator, and a second integrator producing the digital signals in response to the predictor circuit and the first integrator. The integrating capacitor is included in a CDAC, and the digital-to-analog converter also is included in the CDAC.

BRIEF DESCRIPTION OF THE DRAWINGS

FIG. 3 is a detailed block/schematic diagram of the current measurement and digitizing system of FIG. 2.

DETAILED DESCRIPTION OF THE PREFERRED EMBODIMENT

Figure 2:
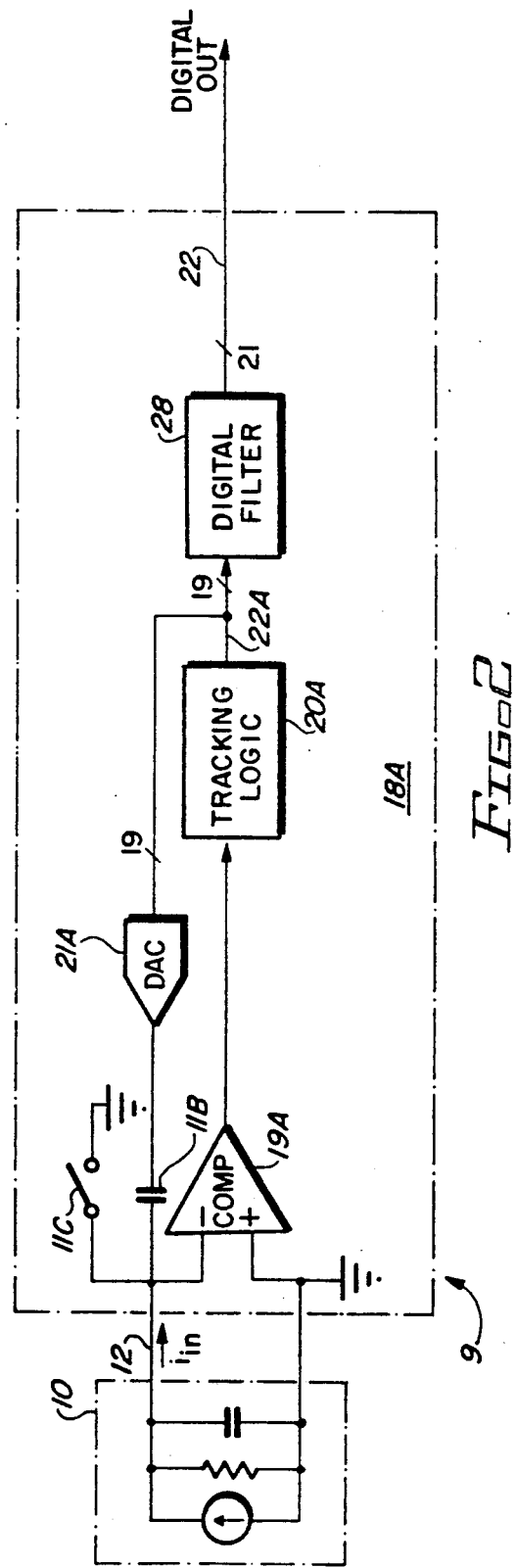
FIG. 2 is a general block diagram of the current measurement and digitizing system of the present invention.

Referring to FIG. 2, current integrating-digitizing circuit 9 receives an analog output current $i_{in}$ on conductor 12 from sensor 10. Conductor 12 is connected to one terminal of integrating capacitor 11B, the other terminal of which is connected to the output of digital-to-analog converter (DAC) 21A. A reset switch 11C coupled between conductor 12 and ground resets conductor 12 to ground at the beginning of each integration cycle.

The inverting input of a comparator 19A is connected to conductor 12. The non-inverting input of comparator 19A and the lower terminal of sensor 10 are connected to ground.

The output of comparator 19A is connected to the input of tracking logic circuit 20A, subsequently described in more detail with reference to FIG. 3. Tracking logic circuit 20A has 19 digital output lines that are connected to the inputs of DAC 21A. Lines 22A also are connected to corresponding inputs of a digital filter 28. The outputs of digital filter 28 are connected to 21 conductor output bus 22 and carry a high resolution digital representation of $i_{in}$. Dotted line 18A indicates the portion of the circuitry in FIG. 2 that can be incorporated in a single integrated circuit chip at the present state of the art. Furthermore, if sensor 10 is a photodiode, it also may be included on the integrated circuit chip 18A.

Figure 1:
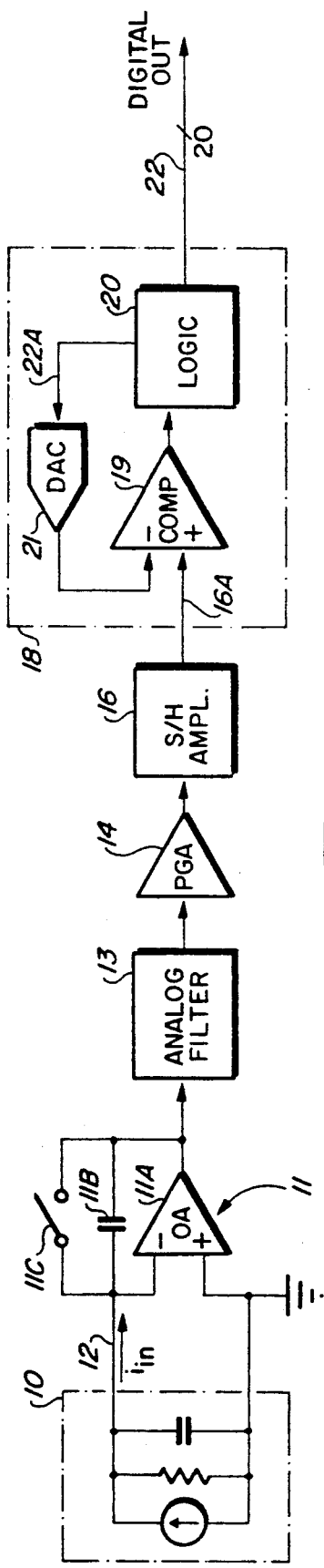
FIG. 1 is a block diagram of a prior art current measurement digitizing system.

It can be seen that the operational amplifier 11A of the prior art circuit of FIG. 1 has been eliminated from the circuit of FIG. 2. Analog filter 13, programmable gain amplifier 14, and sample and hold circuit 16 also have been eliminated from the embodiment of FIG. 2.

Circuitry 20A of FIG. 2 performs a tracking function such that the output of comparator 19A is sampled many times during a single integration cycle. Digital filter 28 filters the digital output signal 22A to reduce electrical noise of the system.

In accordance with the present invention, digital output 22A is sampled at the beginning of each integration cycle and then again at the end of that integration cycle before the integrating capacitor 11B is reset. Resetting of integrating capacitor 11B occurs at the time DAC 21A is reset by tracking logic 20A at the end of an integration cycle. The end of the integration cycle is controlled by the user. The integration cycle time is limited to the maximum charge which can be accumulated by integrating capacitor 11B and the maximum output voltage of DAC 21A.

Digital filter 28 is an "oversampling filter" which takes multiple samples of the digital output 22A and averages them. Digital filter 28 thereby reduces the wideband electronic noise of the circuit shown in FIG. 2 in addition to filtering the wideband noise of the input signal $i_{in}$.

It should be appreciated that for each integration cycle of analog-to-digital converter 18A, there are error sources that remain constant during the entire integration cycle. Such error sources include kT/C noise which occurs on resetting the integrating capacitor 11B, reset switch charge injection errors, comparator input voltage offset errors, and errors associated with DAC 21A.

After resetting the integration capacitor at the beginning of an integration cycle, an initial measurement of the digital output on bus 22A may be taken, and a final measurement may be taken at the end of the integration cycle. By subtracting the initial measurement of the digital output signal 22A from the final measurement (which can be referred to as "double correlated sampling"), the above error sources are substantially canceled.

More specifically, at the beginning of each integration cycle and after a short reset interval, the circuit of FIG. 2 tracks the integration of the input signal $i_{in}$ for a few clock periods to ensure accuracy of tracking, and an initial data point then is measured. The circuit of FIG. 2 continues to track the signal produced by integrating $i_{in}$ to the end of the integration cycle to a point where a final data point is measured. The initial data point then is subtracted from the final data point, eliminating the integration cycle errors mentioned above. Other low frequency errors, such as flicker noise of comparator 19A and offset voltage drift of comparator 19A, are significantly reduced by the foregoing double correlated sampling technique. Oversampling of the initial and final data points can be performed to further improve the accuracy of the integration measurement.

A more detailed implementation of the circuit of FIG. 2 is shown in FIG. 3. In FIG. 3, DAC 21A is implemented by means of an 18 bit CDAC (capacitor digital-to-analog converter). CDACs are well known to those skilled in the art. For example, see FIG. 2 of commonly assigned U.S. Pat. No. 4,940,981 issued July 10, 1990 to Naylor et al. and commonly assigned U.S. Pat. No. 4,947,169 issued Aug. 7, 1990 to Smith et al., incorporated herein by reference. In this embodiment, integrating capacitor 11B of FIG. 3 does not need to be provided as a discrete device, because the various capacitors within CDAC 21A together perform the same overall integrating capacitor function as capacitor 11B.

Portion 21A-1 of CDAC 21A is referred to as the "main CDAC". Portion 21A-2 is referred to as the "trim CDAC", which will be well understood by those skilled in the art. A reference voltage for CDAC 21A is generated by reference voltage amplifier 32, one input of which is connected to an external reference voltage 35.

Main CDAC 21A-1 includes a plurality of switches S1, S2, ... S18 and a plurality of capacitors C1, C2, ... C18 connected in a conventional fashion between the various switches, and an output conductor 38. The foregoing switches are actuated in response to the 18 digital inputs 22A. Twelve bit trim CDAC 21A-2 is of similar construction.

Conductor 38 is connected by a resistor 37 to the inverting input of comparator 19A, the non-inverting input of which is connected to ground, as in FIG. 2. The function of resistor 37 is to minimize CDAC-produced voltage transients produced on conductor 38. Resistor 37 filters CDAC switching transients on conductor 38, reducing transient voltages on the inverting input of comparator 19A, and therefore reduces the magnitude of transient voltages impressed on the sensor 10. A sampling signal CLOCK performs the function of updating the comparator output.

Tracking logic 20A includes a first integrator 40, a predictor circuit 41, and a second integrator 42. It may be helpful to understand that predictor circuit 42 has some resemblance to the adaptive portion of a typical delta modulator circuit that stores a "step rate" input to integrator 40 for a number of previous cycles. In the circuit of FIG. 3, that step rate information is summed with the output of the first integrator 40 and summed into the second integrator 42. Thus, predictor circuit 41 stores step rate information that allows the output of comparator 19A to "dither" between +1 and −1 when the output of CDAC 21A on conductor 38 is tracking properly.

During a reset interval, predictor circuit 41 stores the value it had at the end of the previous integration cycle, so that at the beginning of a new integration cycle the step rate will continue at the same rate at which it ended during the previous integration cycle. Predictor circuit 41 therefore continues to track the signal at its step rate from the end of one integration cycle to the beginning of the next. This function is very useful in conjunction with sensors which have bandwidth limited output signals.

In FIG. 3, first integrator 40 includes a summing circuit 40A having one input connected to an output of a conditional inverting circuit 40D. Conditional inverting circuit 40D includes one input connected to the 12 outputs of register 40B and another input connected to an output of a sign compare circuit 40C. Sign compare circuit 40C has one input connected to the output of comparator 19A and an input connected to the sign bit output of register 40B. Another set of 12 inputs of summing circuit 40A is connected by a ÷4 circuit 40E to 12 corresponding outputs of register 40B. The 12 outputs of summing circuit 40A are connected to corresponding 12 conductors of bus 50, which are fed back into the corresponding inputs of register 40B.

Predictor circuit 41 includes a 12 bit summing circuit 41A that receives the corresponding 12 lines of bus 50. The outputs of summer 41A are connected to the 12 conductors of bus 52. Summer 41A also receives 12 digital inputs from divide-by-eight circuit 41B. Divide-by-eight circuit 41B receives the 15 conductors of an output of a summer 41D. Summer 41D receives as inputs the 12 lines of bus 50 and also receives as another set of inputs the outputs of 15 bit register 41E. The 15 outputs of summer 41D are connected to the 15 inputs of register 41E.

Second integrator 42 includes a 19 bit summer 42A that receives as inputs the 12 lines of bus 52 and also receives as another set of 19 inputs the outputs of a 19 bit register 42B. Register 42B receives on its inputs the 19 lines of bus 54 connected to the output of summer 42A. A cycle reset circuit 42C performs the function of resetting DAC 21A at the end of each integration cycle. At the same time cycle reset circuit 42C applies a control signal to reset register 42B, the cycle reset circuit 67 resets the capacitors of CDAC 21A. Bus 54 is connected to the inputs of latch 42D, the outputs of which are connected to bus 22A.

Digital filter circuit 28 includes a circuit 28D, called a "Data Sample Control Circuit", that controls data acquisition. The signal INITIAL DATA SAMPLE CONTROL causes circuit 28D to perform the function of producing on 19 bit bus 49 the two's complement of the digital number on bus 22A. When the signal FINAL DATA SAMPLE CONTROL is applied, the digital number on bus 22A is passed to circuit 28D to bus 49. Filter circuit 28 also includes a 27 bit summer 28A that receives as one set of inputs the 19 conductors of bus 49. The outputs of 27 bit register 28B are applied to another set of 27 corresponding inputs of summer 28A. Summer 28A produces 27 outputs 72 which are connected to corresponding inputs of register 28B. Register 28B can store a maximum of 256 final data point samples. Such final data points may all occur in one integration cycle, or may be distributed among multiple integration cycles. A conversion cycle may consist of one to 256 integration cycles. An integration cycle may consist of 1, 2, 4, 8 ... 256 final data points. The number of integrations per conversion may consist of 1, 2, 4, 8 ... 256 conversion cycles. The number of conversion cycles multiplied by the number of final data points per integration cycle must be equal to 256 or less. Conversion cycle reset circuit 28C resets register 28B at the end of a conversion cycle. This allows a conversion time for system 9 to be set independently of the integration cycle time. Often integration cycle time is not equal to the needed conversion time. Integration time is limited by the total charge accumulation capability of integrating capacitor 11B and the maximum output voltage of DAC 21A or CDAC maximum charge accumulation. Conversion cycle time can be used to control output data rate, to control data acquisition period, or to reject unwanted repetitive noise signals. (Therefore, independent control of integration cycle time and conversion time is desirable.)

Usually there is enough noise on the input signal $i_{in}$, and also additional electrical noise added by the various circuitry in the current measurement-digitizing system that the output of DAC 21A in FIG. 2 is accurate only to within perhaps two or three LSBs. The output of DAC 21A dithers around the true value because of the electrical noise. Digital filter 28 increases this accuracy by oversampling the data on bus 54 in a conventional fashion and averaging the oversampled values of digital output 22A, thereby averaging the electrical noise and producing increased resolution of the digital output data on bus 22.

The dynamic range for the prior art circuit of FIG. 1 is the number of bits of programmable gain amplifier 14 multiplied by the number of bits of DAC 21. The embodiment of FIG. 2 allows the oversampling by digital filter 28 to increase the resolution by about the same amount that programmable gain amplifier 14 increases the dynamic range of the embodiment of FIG. 1. For a present design the accuracy and resolution of DAC 21A in FIG. 2 are roughly the same as that of DAC 21 in prior art FIG. 1.

In the prior art circuit of FIG. 1, a single measurement of the output of amplifier 11A is taken at the end of the integration cycle. That point is the point at which the sample and hold circuit 16 samples the output of programmable gain amplifier 14. The sampled voltage represents the amount of charge flowing into integrating capacitor 11B during the integration cycle, and hence represents $i_{in}$.

Tracking logic 20A of FIG. 2 causes a progression in the value of the digital input on bus 22A to DAC 21A in response to the output of comparator 19A. If the non-inverting input of comparator 19A goes positive, comparator 19A causes the tracking logic to decrease the value of the digital word applied to the inputs of DAC 21A. The negative feedback causes DAC 21A to produce the same voltage across integrating capacitor 11B as would occur by integrating the input current $i_{in}$ in the prior art circuit of FIG. 1. In FIG. 2, the inputs of DAC 21A are reset at the same time that reset switch 11C is closed to reset integrating capacitor 11B.

Tracking logic 20A in both FIGS. 2 and 3 has the capability of measuring and storing the tracking rate and using that information to improve tracking, especially at the beginning of an integration cycle. Nineteen bit register 42B of integrator 42 in FIG. 3 stores the previous word input to DAC 21A. Twelve bit bus 52 supplies new step rate information which is summed with the previous DAC input. Reset circuit 42C of integrator 42 causes inputs 22A of DAC 21A to be reset to all "zero's" or other suitable initial condition at the end of a conversion cycle. This is performed at the same time that integrating capacitor 11B of FIG. 2 would be reset and at the time all of the capacitors of CDAC 21A of FIG. 3 are reset to the initial condition. (The capacitors of CDAC 21A are reset to the desired initial condition by the resetting of integrator 42.)

The purpose of predictor circuit 41 is to hold the step rate information and make it available each sample cycle for the purpose of improving the tracking of $i_{in}$ by DAC 21A and preventing an unacceptably large number of adjustments of the step rate to effectuate close tracking. Predictor circuit 41 stores the average step rate in register 41E. It is sensed from bus 50 and fed into summer 41D which, with register 41E, forms an integrator. The 15 bit output of summer 41D is fed into the divide-by-eight circuit 41B. The output of divide-by-eight circuit 41B is the average step rate measured from bus 52.

If predictor circuit 41 were not used, an unacceptably large number of clock cycles would be required to increment integrator 42 and there would have to be a very large number of adjustments of the step rate. In other words, DAC 21A would not be tracking $i_{in}$ very well because tracking would rely only on an output from integrator 40. Predictor circuit 41 looks at how fast integrator 40 has been ramping in the past. Integrator 40 and predictor circuit 41 thus provide a means by which integrator 42 can step at a variable rate to accommodate changing input signals. Predictor 41 also stores information to indicate from what rate integrator 42 begins ramping at the beginning of a new integration cycle.

When the system of FIG. 3 is turned on, predictor circuit 41 is reset to zero. Output integrator 42 steps at a rate of approximately zero. If there is an input signal, integrator 40 counts up. The high level count is sampled by predictor 41. The predictor then outputs that higher level count.

It should be understood that predictor circuit 41 must respond slowly enough that the circuitry forming the feedback loop can be stable and avoid oscillation. Hence the divide-by-eight function. A problem with using two integrators 40 and 42 is that providing two integrators in a feedback loop usually results in instability, unless there is some form of compensation such compensation is achieved by the response of integrator 40.

Integrator 40 includes a "sign compare" circuit 40C. If the output of comparator 19A changes polarity from that of its previous cycle, the information in register 40B will be reset to a value that is not the result of a simple integration.

A sign change produced by comparator 19A is always detected by sign compare circuit. One-fourth of the present value of the contents of register 40B are added into summer 40A along with the output of "invert on sign change" logic 40D. Depending upon whether a sign change has been detected or not, ±1 multiplied by the contents of register 40B are added to one-fourth of the present value. Therefore, the output of integrator 40 is either 1.25 times its previous output or −0.75 times its previous output.

The action of integrator 40 not only prevents oscillation, but also improves response to transient input signals. By incrementing with a 1.25 multiplier, tracking logic 20A may step the digital inputs 22A to rapidly respond to transient signals. Upon successful tracking, the output of integrator 40 will quickly reduce in value according to a −0.75 multiplier. As such, integrator 40 will dither at a low level with step rate tracking accommodated by predictor circuit 41. Stated differently, integrator 40 can be thought of as a non-linear circuit that responds quickly to a large input signal change and responds relatively slowly to a small input signal change so as to maintain loop stability.

It should be appreciated that a result of adding ± a percentage of the contents of register 40B is that it is possible to count to less than one. It is necessary, however, that the number which is stored in register 40B never equals zero, and a suitable protective mechanism is incorporated in the circuitry to avoid this. The minimum value of register 40B therefore will be ±1. In addition, a minimum result of the divide by 4 circuit 40E is limited to ±1 LSBs. The rationale for this approach is to create an output cycle which will dither in a complementary fashion around zero. Since the output is averaged, the output of integrator 40 is complementary around zero for DC inputs and low frequency inputs.

An advantage of this method of producing an output of integrator 40 is that it will dither about zero for a DC (or essentially DC) input. This pattern occurs at a high frequency close to the sampling clock rate. It gets produced at the output of integrator 42 each cycle, causing DAC 21A to dither the comparator input around zero.

Output filter 28 averages the initial data point and final data point of an integration cycle. The user specifies which data points are the initial and final data point. The purpose of output filter 28 is to oversample the stepped digital word driving CDAC 21A.

Output filter 28 oversamples the digital code applied to CDAC 21A and performs an averaging of the digital code and performs a division to obtain an initial data point at the beginning of an integration cycle. Output filter 28 performs a similar operation to obtain a final data point measurement. The initial data point then is subtracted from the final data point. The initial and final DATA CONTROL signals in output filter 28 control the oversampled accumulation and the above-mentioned subtraction. In a continuous mode of operation, the initial data point is measured right after the final data point measurement. In a non-continuous mode of operation, the user controls the beginning of the integration cycle and then controls the final data point measurement. The initial data point can be optionally set to zero with no initial measurement subtracted.

It should be appreciated that a conversion cycle of current integrating-digitizing circuit 9 may consist of a collection of several integration cycles, although a conversion cycle optimally consists of one integration cycle.

Referring to CDAC 21A, all of its capacitors in combination are equivalent to integrating capacitor 11B of FIG. 2. The purpose of each bit of CDAC 21A is to accumulate a certain amount of charge in response to each new digital input applied by tracking logic 20A to the digital inputs of CDAC 21A. When a particular bit of CDAC 21A is switched to the reference voltage produced by reference voltage amplifier 32, a corresponding capacitor for that bit stores an amount of charge equal to the reference potential multiplied by the capacitance of that capacitor. As more charge, resulting from flow of $i_{in}$, flows into CDAC 21A, the bit capacitors of a new bit combination are switched.

The physical mechanism for accumulating charge in the capacitors of DAC 21A is to sequentially charge up various capacitances of the various CDAC bits, whereas for the circuit of FIG. 2, successive codes applied to the digital inputs of CDAC 21A result in voltage changes at the output of DAC 21A being applied across integrating capacitor 11B to effectuate charge accumulation. Charge accumulated on the various capacitors of CDAC 21A flows into conductor 38 to produce a corresponding voltage thereon when terminals of the CDAC capacitors are switched to the reference voltage. Negative feedback through comparator 19A effectuates such voltage changes on conductor 38. In both FIGS. 2 and 3, a correct level of charge on integrating capacitor 11B or the capacitors of CDAC 21A causes the inverting input of comparator 19A to be at zero volts, and any other value of accumulated charge causes the inverting input of comparator 19A to move away from zero.

It should be understood that integrating capacitor 11B of FIG. 2 is likely to have an associated voltage coefficient which prevents the output voltage from increasing linearly with increasing charge stored thereon. This non-linearity results in inaccurate digital output on bus 22. However, in the embodiment of FIG. 3 the capacitors of the eight most significant bits are switched only between two voltage levels, ground voltage and the reference voltage. Consequently, the charge changed on each of the corresponding capacitors of CDAC 20A is a discrete, quantized amount that is independent of intermediate voltages or charge accumulated in response thereto. The effect of the above-mentioned nonlinear voltage coefficients is therefore avoided. The values of charge stored are therefore related only to the relative areas of the capacitances.

As previously mentioned, for each integration cycle there are cycle-dependent errors including kT/c (reset noise), and charge injection noise caused by switching the capacitors. By taking the above-described initial measurement and final measurement at the beginning and end of each integration cycle, the foregoing integration cycle-dependent errors are eliminated by the subtraction. The input offset errors also are cycle-dependent errors.

While the invention has been described with reference to several particular embodiments thereof, those skilled in the art will be able to make the various modifications to the described embodiments of the invention without departing from the true spirit and scope of the invention. It is intended that all combinations of elements and steps which perform substantially the same function in substantially the same way to achieve the same result are within the scope of the invention.

What is claimed is:

1. A current-integrating analog-to-digital converter, comprising in combination:
   (a) a comparator having a non-inverting input coupled to receive a ground voltage and an inverting input coupled to an input conductor;
   (b) an integrating capacitor having a first terminal coupled to the input conductor, an input current flowing through the input conductor;
   (c) a digital-to-analog converter having an output coupled to a second terminal of the integrating capacitor;
   (d) tracking means coupled to an output of the comparator for producing digital signals on digital inputs of the digital-to-analog converter to maintain the inverting input close to a virtual ground voltage;

wherein a digital signal on the inputs of the digital-to-analog converter represents the integral of the input current.

2. The current-integrating analog-to-digital converter of claim 1 including digital filtering means coupled to receive the digital signals and filter them to produce a digital output signal that precisely represents the input current.

3. The current-integrating analog-to-digital converter of claim 1 wherein the tracking means includes a first integrator having an input coupled to the output of the comparator, predictor circuit means for producing average step rate information in response to an output of the first integrator, and a second integrator producing the digital signals in response to the predictor circuit means.

4. The current-integrating analog-to-digital converter of claim 3 including means responsive to the tracking means for resetting the integrating capacitor to a reference voltage at the beginning of each integration cycle.

5. The current-integrating analog-to-digital converter of claim 3 wherein the predictor circuit means includes means for storing step rate information for a present integration cycle until the beginning of a next integration cycle and means for summing the stored step rate information with next integration cycle step rate information to effectuate an effective transition from the present integration cycle to the next integration cycle.

6. The current-integrating analog-to-digital converter of claim 3 wherein the first integrator includes means for responding relatively rapidly to a large change of the input current and relatively slowly to a small change of the input current to thereby maintain stability of a loop including the comparator, the integrating capacitor, the tracking means, and the digital-to-analog converter.

7. The current-integrating analog-to-digital converter of claim 6 wherein the responding means includes a sign compare circuit having a first input coupled to the output of the comparator, a conditional inverting circuit means for conditionally inverting a digital number applied to its inputs, a summer having a first set of inputs coupled to a set of outputs of the conditional inverting circuit, a register having a set of inputs coupled to a set of outputs of the summer and a set of outputs coupled to a second set of inputs of the conditional inverting circuit means, a dividing circuit coupling the outputs of the register to a second set of inputs of the summer, and a sign bit conductor coupling a sign bit output of the register to a second input of the sign compare circuit.

8. The current-integrating analog-to-digital converter of claim 1 wherein the integrating capacitor is included in a CDAC, and the digital-to-analog converter also is included in the CDAC.

9. A method of converting an analog current to a digital representation of the analog current, comprising the steps of:
   (a) conducting the analog current through an input conductor coupled to a first terminal of an integrating capacitor and an inverting input of a comparator;

(b) switching the level of an output of the comparator in accordance with whether the inverting input is above or below a first reference voltage applied to a non-inverting input of the comparator;

(c) producing digital signals in response to the output of the comparator and applying the digital signals to inputs of a digital-to-analog converter having an output connected to a second terminal of the integrating capacitor so as to increase the voltage of the inverting input if it is below the first reference voltage and decrease the voltage of the inverting input if it is above the first reference voltage, wherein a digital signal on the inputs of the digital-to-analog converter represents the integral of the analog current.

10. The method of claim 9 including digitally filtering the digital signals to produce a digital output that precisely represents the analog input current.

11. The method of claim 10 including subtracting an initial value of the digital output at the beginning of an integration cycle from an ending value of the digital output at the end of that integration cycle to eliminate integration cycle-dependent errors.

12. The method of claim 10 including integrating the output of the comparator to produce a group of step rate numbers for a present integration cycle, producing an average step rate number from the group rate numbers, and storing a first step rate number for the present integration cycle, and summing the stored first step rate number and the group of step rate numbers for the next integration cycle to produce the digital signals, to effectuate efficient tracking of the output of the digital-to-analog converter with respect to the analog current from the present integration cycle to the next integration cycle.

13. The method of claim 9 wherein step (c) includes resetting the integrating capacitor to a second reference voltage before the beginning of each integration cycle.

14. The method of claim 13 including performing a plurality of integration cycles within each conversion cycle in which the analog current is converted to a digital representation thereof.

15. A circuit for integrating an analog current to produce a digital representation of the analog current, comprising in combination:

(a) an integrating capacitor;

(b) a comparator;

(c) means for conducting the analog current through an input conductor coupled to a first terminal of the integrating capacitor and an inverting input of the comparator, the comparator switching the level of an output of the comparator in accordance with whether the inverting input is above or below a first reference voltage applied to a non-inverting input of the comparator;

(d) a digital-to-analog converter having an output connected to a second terminal of the integrating capacitor;

(e) means for producing digital signals in response to the output of the comparator and applying the digital signals to inputs of the digital-to-analog converter so as to increase the voltage of the inverting input if that voltage is below the first reference voltage and decrease the voltage of the inverting input if that voltage is above the first reference voltage, wherein a digital signal on the inputs of the digital-to-analog converter represents the integral of the analog current.

16. The circuit of claim 15 including means for digitally filtering the digital signals to produce a digital output that precisely represents the analog input current.

17. The circuit of claim 16 including means for subtracting an initial value of the digital output at the beginning of an integration cycle from an ending value of the digital output at the end of that integration cycle to eliminate cycle-dependent errors.

18. The circuit of claim 15 including means for resetting the integrating capacitor to a second reference voltage before the beginning of each integration cycle.

19. The circuit of claim 18 wherein the digital signal producing means includes predictor means for storing step rate information for a present integration cycle until the beginning of a next integration cycle and means for summing the stored step rate information with next integration cycle step rate information to effectuate an effective transition from the present integration cycle to the next integration cycle.

* * * * *